United States Patent
Behringer et al.

(10) Patent No.: US 9,320,089 B2
(45) Date of Patent: Apr. 19, 2016

(54) OPTOELECTRONIC SEMICONDUCTOR CHIP, DISPLAY COMPRISING A SEMICONDUCTOR CHIP OF THIS TYPE, AND USE OF A SEMICONDUCTOR CHIP OF THIS TYPE OR OF A DISPLAY

(75) Inventors: Martin Rudolf Behringer, Regensburg (DE); Oliver Guenther, Rueckersdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 221 days.

(21) Appl. No.: 14/125,028

(22) PCT Filed: Jun. 6, 2012

(86) PCT No.: PCT/EP2012/060730
§ 371 (c)(1),
(2), (4) Date: Feb. 27, 2014

(87) PCT Pub. No.: WO2012/168316
PCT Pub. Date: Dec. 13, 2012

(65) Prior Publication Data
US 2014/0210348 A1    Jul. 31, 2014

(30) Foreign Application Priority Data
Jun. 9, 2011    (DE) .......................... 10 2011 103 786

(51) Int. Cl.
H05B 33/08    (2006.01)
H01L 33/14    (2010.01)
H01L 33/44    (2010.01)
H01L 33/62    (2010.01)

(52) U.S. Cl.
CPC ............... *H05B 33/08* (2013.01); *H01L 33/44* (2013.01); *H05B 33/0845* (2013.01); *H01L 33/62* (2013.01); *H01L 2924/0002* (2013.01)

(58) Field of Classification Search
USPC ............................. 315/112–118; 257/78–102
See application file for complete search history.

(56) References Cited

U.S. PATENT DOCUMENTS

| | | | | |
|---|---|---|---|---|
| 6,054,716 | A * | 4/2000 | Sonobe | H01L 25/167 250/552 |
| 2006/0157718 | A1 | 7/2006 | Seo et al. | |
| 2007/0030611 | A1* | 2/2007 | Cho | H01L 27/0288 361/58 |
| 2008/0290351 | A1* | 11/2008 | Ajiki | H01L 25/0753 257/88 |

FOREIGN PATENT DOCUMENTS

| | | |
|---|---|---|
| CN | 1909238 A | 2/2007 |
| CN | 1971907 A | 5/2007 |
| EP | 1750309 A2 | 2/2007 |
| JP | 2004136838 * | 5/2004 |
| WO | 2009004520 A1 | 1/2009 |
| WO | 2009152062 A2 | 12/2009 |

* cited by examiner

Primary Examiner — Douglas W Owens
Assistant Examiner — Jonathan Cooper
(74) Attorney, Agent, or Firm — Slater & Matsil, L.L.P.

(57) ABSTRACT

An optoelectronic semiconductor chip includes a semiconductor layer sequence having an active layer provided for generating radiation. The semiconductor chip can be operated in a first operating mode and in a second operating mode. The semiconductor layer sequence emits radiation in the first operating mode, while the semiconductor layer sequence emits no radiation in the second operating mode. The semiconductor layer sequence is operated in the forward direction in the first operating mode and in the reverse direction in the second operating mode. A display including a number of semiconductor chips of this type and a use as a motor vehicle headlight are furthermore specified.

18 Claims, 1 Drawing Sheet

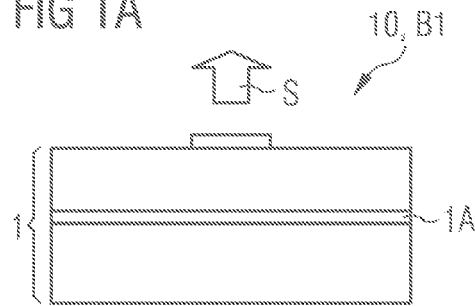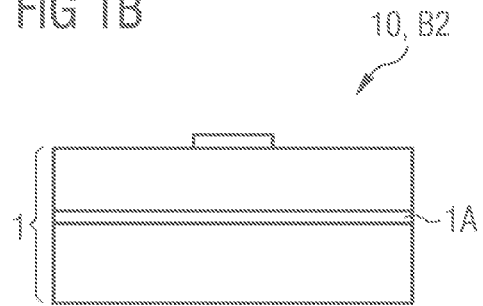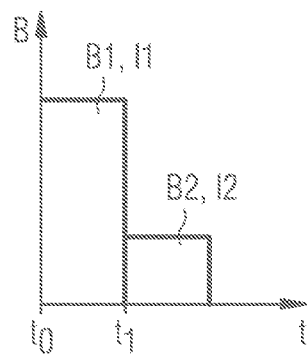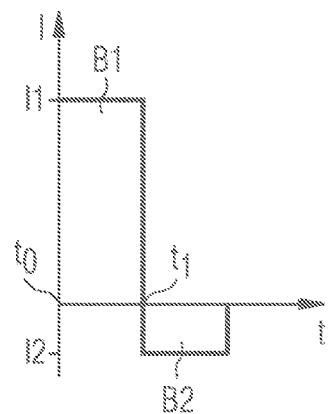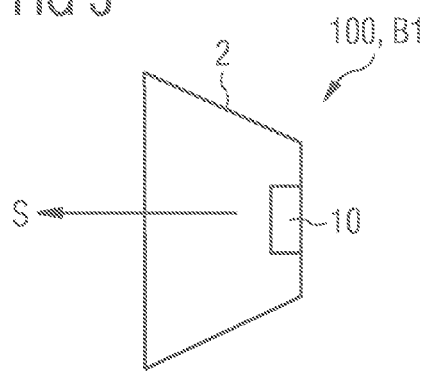

OPTOELECTRONIC SEMICONDUCTOR CHIP, DISPLAY COMPRISING A SEMICONDUCTOR CHIP OF THIS TYPE, AND USE OF A SEMICONDUCTOR CHIP OF THIS TYPE OR OF A DISPLAY

This patent application is a national phase filing under section 371 of PCT/EP2012/060730, filed Jun. 6, 2012, which claims the priority of German patent application 10 2011 103 786.5, filed Jun. 9, 2011, each of which is incorporated herein by reference in its entirety.

TECHNICAL FIELD

The invention relates to an optoelectronic semiconductor chip that can be operated in two operating modes. The present invention furthermore relates to a display comprising a plurality of semiconductor chips of this type, and to a use of a semiconductor chip or display of this type.

BACKGROUND

Semiconductor chips such as, for example, light-emitting diodes (LEDs) age more rapidly under the influence of moisture than in a dry atmosphere. This ageing process is based, inter alia, on corrosion effects and leakage currents in or at the semiconductor chip. This ageing process is particularly pronounced when the LEDs are not operated, since the latter are then at a lower temperature than in the operating state, as a result of which a film of liquid can form, for example, directly on the semiconductor chip on account of condensation of moisture stored in the air. A liquid film of this type disadvantageously fosters and accelerates the degradation of the semiconductor chip.

Furthermore, the wavelength of the radiation emitted by the semiconductor chip disadvantageously shifts with a change of temperature in the semiconductor chip. By way of example, such a wavelength shift based on temperature changes can occur upon switch-on and start-up of the semiconductor chip or during pulsed operation of the semiconductor chip.

In order to reduce the above mentioned disadvantages of the ageing effects and wavelength shifts, it is conventionally known, for example, to form a protective housing or a protective coating on the semiconductor chip, which keep the moisture away from the semiconductor chip and thus make the semiconductor chip more stable against corrosion at the expense of the luminous efficiency and radiation efficiency.

SUMMARY OF THE INVENTION

Embodiments of the present application specify a semiconductor chip which avoids the disadvantages mentioned above, thereby advantageously resulting in an ageing-stable semiconductor chip which has an optimum luminous efficiency and, in addition, a small wavelength shift on account of reduced temperature changes in the semiconductor chip.

In one embodiment, the optoelectronic semiconductor chip comprises a semiconductor layer sequence having an active layer provided for generating radiation. The semiconductor chip can be operated in a first operating mode and in a second operating mode. The semiconductor layer sequence emits radiation in the first operating mode. The semiconductor layer sequence emits no radiation in the second operating mode. The semiconductor layer sequence is operated in the forward direction in the first operating mode and in the reverse direction in the second operating mode. In other words, the semiconductor chip can be operated in two separate operating modes that are different from one another.

The semiconductor chip thus has two operating modes, wherein the semiconductor chip emits radiation only in the first operating mode. Accordingly, the second operating mode should be regarded as an optically switched-off operating state with regard to the emission of radiation. According to the invention, in this case the semiconductor chip is operated with a current in the reverse direction in said optically switched-off operating state. Operation in the reverse direction and not in the forward direction serves, in particular, the purpose that the semiconductor chip emits no radiation in the second operating mode.

As a result of operation in the reverse direction, the semiconductor chip is advantageously heated without emitting radiation in the process, as a result of which condensation effects at the semiconductor chip which can occur on account of moisture occurring in the environment of the semiconductor chip are advantageously reduced. As a result, it is advantageously possible to obtain a longer lifetime of semiconductor chips of this type in moist environments. A moist environment is considered to be, in particular, an environment in which condensation effects can occur when the semiconductor chip is not operated, such as, for example, in the tropics, by the sea or at night.

Alongside the moisture stability, a semiconductor chip of this type is additionally distinguished by a wavelength stability of the radiation emitted by the semiconductor chip during pulsed operation, since the semiconductor chip can be kept at a higher temperature even in the optically switched-off operating state on account of the energization in the reverse direction. Furthermore, the warm-up time of semiconductor chips of this type can thus be shortened, as a result of which they can attain their predetermined operating performance (so-called "steady state") significantly more rapidly. This is advantageous particularly in the case of displays comprising a plurality of semiconductor chips.

In connection with the present application, "operation" means that the semiconductor chip can be acted on externally in a predeterminable manner with electric current, impression of electrostatic charge into the semiconductor chip or into individual components of the semiconductor chip and/or application of electrical voltage to the semiconductor chip, such that the active layer of the semiconductor chip is suitable for emitting electromagnetic radiation.

"Operation of the semiconductor chip in two operating modes" means that that semiconductor chip can be set externally in a predeterminable manner in each operating mode, for example, with regard to the operating parameters, the energization level, operating current, operating voltage, operating duration, operating temperature and/or impression level of electrical charges into the semiconductor chip.

Operating the semiconductor layer sequence in the reverse direction means that a reverse current flows through the semiconductor layer sequence. In this case, the reverse direction is in the opposite direction to the forward direction.

The semiconductor chip is an optoelectronic semiconductor chip which makes it possible to convert electrically generated data or energies into light emission, or vice versa. By way of example, the optoelectronic semiconductor chip is a radiation-emitting semiconductor chip, for example an LED.

The active layer of the semiconductor layer sequence preferably contains a pn-junction, a double hetero structure, a single quantum well (SQW) structure or a multi quantum well (MQW) structure for generating radiation. In this case, the designation quantum well structure does not manifest any significance with regard to the dimensionality of the quantization. It encompasses, inter alia, quantum wells, quantum wires and quantum dots and any combination of these structures.

The semiconductor chip, in particular the active layer, preferably contains a III/V semiconductor material. III/V semiconductor materials are particularly suitable for generating radiation in the ultraviolet, through the visible right into the infrared spectral range. The semiconductor chip comprises a plurality of semiconductor layers which are deposited epitaxially one on top of another and in which the active layer is arranged. By way of example, the layers of the semiconductor chip are grown on a growth substrate. In this case, the active layer separates a p-doped side of the semiconductor chip from an n-doped side of the semiconductor chip.

In accordance with at least one embodiment, the semiconductor chip comprises at least one drive device for operating the semiconductor chip in the first operating mode and in the second operating mode. Accordingly, the drive device operates the semiconductor chip in the first operating mode or in the second operating mode in a predeterminable manner. Accordingly, the drive circuit acts on the semiconductor chip with electric current in a predeterminable manner. In this case, the drive device acts on the semiconductor chip with current in the reverse direction in the second operating mode and with current in the forward direction in the first operating mode. Accordingly, the semiconductor chip can be operated in both operating modes with a single drive device.

In accordance with at least one embodiment, a leakage path is formed in the semiconductor layer sequence, a predetermined reverse current flowing via said leakage path in the second operating mode. This means that not all of the semiconductor layer sequence is operated in the reverse direction. A leakage path is incorporated in the semiconductor layer sequence, the defined and predetermined reverse current flowing via said leakage path upon reverse-biasing in the second operating mode. The semiconductor chip can thus advantageously be heated in the second operating mode.

In accordance with at least one embodiment, a passivation layer is arranged on the semiconductor layer sequence, wherein the leakage path is implemented via the passivation layer. Preferably, the leakage path via the semiconductor layer sequence or a contact structure of the semiconductor chip is created such that, upon forward-biasing of the semiconductor chip, that is to say in the first operating mode, no or only a negligible current flows and, upon reverse-biasing, that is to say in the second operating mode, at a small voltage sufficient current flows to ensure the desired increase in temperature of the semiconductor layer sequence.

In accordance with at least one embodiment, a first operating current flows in the forward direction through the semiconductor layer sequence in the first operating mode, and a second operating current flows in the reverse direction in the second operating mode. In this case, an absolute value of a current intensity of the second operating current is preferably less than an absolute value of a current intensity of the first operating current.

The "absolute value" should be understood to mean, in particular, the modulus, that is to say magnitude, of the respective current intensity, which, in particular, is always a non-negative number. The absolute value corresponds, in particular, to the level of the current intensity, independently of the direction in which the operating current flows.

In accordance with at least one embodiment, the absolute value of the current intensity of the second operating current is 10% or less of the absolute value of the current intensity of the first operating current. In this case, therefore, the absolute value of the current intensity of the second operating current is 0.1 times less than the absolute value of the current intensity of the first operating current. Accordingly, in the second operating mode, in the reverse direction only a small current flows which, in particular, is suitable for heating the semiconductor layer sequence, that is to say for increasing the temperature thereof in a predetermined manner.

In accordance with at least one embodiment, in the second operating mode a temperature of the semiconductor layer sequence is higher by at least 2° C. than a temperature of the semiconductor layer sequence in a switched-off operating state. In this case, the temperature increase in the second operating mode is based on the operation of the semiconductor layer sequence in the reverse direction.

The switched-off operating state is, in particular, not only the optically switched-off operating state. In the switched-off operating state, in particular no current flows through the semiconductor layer sequence. "No current flowing" should be understood to mean, in particular, that neither in the forward direction nor in the reverse direction does a current flow through the semiconductor layer sequence.

In accordance with at least one embodiment, in the second operating mode the temperature of the semiconductor layer sequence is higher by about 10° C. than the temperature of the semiconductor layer sequence in the switched-off operating state.

In accordance with at least one embodiment, in the second operating mode a temperature of the semiconductor layer sequence is higher than an ambient temperature. "Ambient temperature" should be understood to mean, in particular, the temperature of the environment that surrounds the semiconductor chip, that is to say, for example, the air temperature for the case where the semiconductor chip is arranged in a room. In the second operating mode, the semiconductor chip is heated in comparison with the surrounding environment, such that the condensation effect advantageously does not occur or occurs only to a reduced extent, such that the lifetime of the semiconductor chip is advantageously lengthened.

In accordance with at least one embodiment, a display comprises a plurality of semiconductor chips which can be operated in two operating modes, wherein the semiconductor layer sequence of the semiconductor chips emits radiation in the first operating mode, emits no radiation in the second operating mode, and is operated in the forward direction in the first operating mode and in the reverse direction in the second operating mode.

In this case, the semiconductor chips can be arranged, for example, alongside one another on a common carrier.

In accordance with at least one embodiment, a semiconductor chip which can be operated in the first and second operating modes is used as a motor vehicle headlight. Precisely in the case of motor vehicle headlights there is the risk of condensation of moisture on the semiconductor chips of the headlight, which can disadvantageously lead to a degradation of the headlights. This risk can advantageously be counteracted with semiconductor chips operated in the reverse direction in the second operating mode.

The features mentioned in connection with the semiconductor chip are also used in association with the display and the application as a motor vehicle headlight, and vice versa.

BRIEF DESCRIPTION OF THE DRAWINGS

Further advantages and advantageous developments of the invention will become apparent from the exemplary embodiments described below in conjunction with FIGS. 1 to 3.

FIGS. 1A and 1B show a schematic cross section of an exemplary embodiment of a semiconductor chip according to the invention in the first and second operating mode, respectively;

FIGS. 2A and 2B respectively show a diagram illustrating the respective operating mode and the respective operating current as a function of the operating time; and FIG. 3 shows a schematic cross section of an exemplary embodiment of a motor vehicle headlight according to the invention.

In the figures, identical of identically acting component parts may in each case be provided with the same reference symbols. The component parts illustrated and their size relationships among one another should not be regarded as true to scale. Rather, individual component parts such as, for example, layers, structures, components and regions may be illustrated with exaggerated thickness or size dimensions in order to enable better illustration and/or in order to afford a better understanding.

DETAILED DESCRIPTION OF ILLUSTRATIVE EMBODIMENTS

FIG. 1A shows a cross section of a semiconductor chip 10, which is operated in a first operating mode B1. The semiconductor chip 10 is an LED, for example, and comprises an active layer 1a for generating radiation. The semiconductor chip 10 comprises a semiconductor layer sequence 1, in which the active layer 1a is arranged. The semiconductor layer sequence 1 emits radiation S in the first operating mode B1.

Consequently, a first operating current I1 flows through the semiconductor layer sequence 1 in the first operating mode B1. The first operating current I1 flows through the semiconductor layer sequence 1 in particular in the forward direction, such that the active layer 1a emits radiation S.

The semiconductor chip 10 of the exemplary embodiment in FIG. 1A has a second operating mode B2, which is illustrated in the exemplary embodiment in FIG. 1B.

In the second operating mode B2, the semiconductor layer sequence 1, in particular the active layer 1a of the semiconductor layer sequence 1, emits no radiation. This operating state can therefore be described as an optically switched-off state. In order to prevent the influence of moisture, corrosion and leakage currents at the semiconductor chip 10, the semiconductor chip 10 is operated with an operating current I2 in the reverse direction in the optically switched-off operating state, that is to say in the second operating mode B2. In this case, only a small current is employed. On account of this operation in the reverse direction, the semiconductor chip 10 is heated, such that condensation of moisture at the semiconductor chip can be prevented, as a result of which no film of liquid forms at the semiconductor chip, such that an attendant degradation can advantageously be avoided.

In this case, the semiconductor chip is advantageously operated in the reverse direction, such that the semiconductor chip emits no radiation, as a result of which an optically switched-off operating state can be ensured.

By means of a semiconductor chip of this type, having a first operating mode B1 in the forward direction and a second operating mode B2 in the reverse direction, in addition it is advantageously possible to reduce a wavelength shift which can occur on account of high temperature changes in the semiconductor layer sequence. Such wavelength shifts on account of temperature changes occur, in particular, upon switch-on and start-up of the semiconductor chip or during the operation of the semiconductor chip in pulsed operation.

As a result of the second operating mode in the reverse direction, it is possible to obtain an increased lifetime of semiconductor chips of this type in a moist environment. In particular, semiconductor chips of this type can be operated in environments where a condensation effect can occur when the semiconductor chips are not operated, such as, for example, in the tropics, by the sea or at night. Alongside the moisture stability, the wavelength in pulsed operation, for example, can also advantageously be kept more stable, since the semiconductor chip is kept at a predetermined temperature even in the optically switched-off state. As a result, the warm-up time of semiconductor chips of this type is additionally shortened, such that it attains the so-called "steady state" more rapidly. This is helpful particularly in combination with other semiconductor chips.

The semiconductor chip 10 of the exemplary embodiment in FIGS. 1A and 1B is operated by means of a drive device, for example. The drive device is suitable, in particular, for operating the semiconductor chip 10 in both operating modes, B1, B2.

In the second operating mode B2 the temperature of the semiconductor layer sequence 1 is higher by at least 2° C. than the temperature of the semiconductor layer sequence 1 in a switched-off operating state. Switched-off operating state should be understood to mean, in particular, a state in which no operating current flows through the semiconductor layer sequence 1. Preferably, the temperature of the semiconductor layer sequence 1 in the second operating mode is higher by 10° C. than the temperature of the semiconductor layer sequence in the switched-off operating state. As a result of the energization of the semiconductor chip 10 in the reverse direction, the semiconductor chip 10 is thus heated by approximately 10° C., such that condensation effects do not occur. Preferably, in the second operating mode B2 the temperature of the semiconductor layer sequence 1 is higher than the ambient temperature of the semiconductor chip 10, with the result that such liquid deposits from the ambient air at the semiconductor chip are advantageously avoided.

The operation of the semiconductor chips 10 in the reverse direction, as shown in the exemplary embodiment in FIG. 1B, can also be realized through an incorporated leakage path in the semiconductor layer sequence 1. The predetermined reverse current flows via the leakage path in the semiconductor layer sequence 1 in the second operating mode B2. The semiconductor chip 10 can thus advantageously be heated. By way of example, a passivation layer is arranged on the semiconductor layer sequence 1, wherein the leakage path is implemented via the passivation layer. Ideally, the leakage path via the semiconductor chip is created such that, upon forward-biasing, no or only a negligibly small current flows and, upon reverse-biasing, already at a small voltage enough current flows to attain the desired temperature increase of at least 2° C., preferably 10° C.

FIG. 2A shows a diagram relating to a semiconductor chip in accordance with the exemplary embodiment in FIGS. 1A and 1B, said semiconductor chip having a first operating state B1 and a second operating state B2. In the diagram, in particular the operating state B is plotted against the operating time t.

In an operating time between $t_0$ and $t_1$, the semiconductor chip is operated with a first operating current I1 in the forward direction in the first operating mode B1. At the instant $t_1$, the semiconductor chip is changed over into the second operating mode B2 with a second operating current I2. The semiconductor chip emits radiation in the first operating mode B1, while the semiconductor chip emits no radiation in the second operating mode B2, that is to say it is in an optically switched-off state. Accordingly, the semiconductor layer sequence 1 of the semiconductor chip is forward-biased in the first operating mode B1, while the semiconductor layer sequence 1 is reverse-biased in the second operating mode B2.

In this case, the absolute value of the current intensity of the second operating current I2 is less than the absolute value of the current intensity of the first operating current I1. In particular, the absolute value of the current intensity of the second operating current is 10% or less of the absolute value of the current intensity of the first operating current I1.

In the second operating mode B2, the semiconductor chip is accordingly not completely switched off, but rather operated in the reverse direction, such that the temperature increase as discussed in the exemplary embodiment in FIGS. 1A and 1B can be obtained. In particular, the semiconductor chip is operated in the reverse direction with a voltage below the breakdown voltage. In this case, the voltage can be greater than the voltage with which the semiconductor chip is operated as forward voltage.

FIG. 2B shows a diagram in which the operating current I is plotted against the operating time t and which can be assigned, for example, to a semiconductor chip in accordance with the exemplary embodiment in FIGS. 1A and 1B. Between the operating time $t_0$ and $t_1$, the semiconductor chip is operated in the operating mode B1 and has an operating current I1 in the forward direction. At the instant $t_1$, the semiconductor chip is switched from the first operating mode B1 into the second operating mode B2, wherein the semiconductor chip is in this case operated in the reverse direction with a second operating current I2. Accordingly, on account of the reverse-biasing, the second operating current I2 is in the opposite direction to the first operating current I1. In this case, the absolute value of the current intensity of the second operating current is significantly less than the absolute value of the current intensity of the first operating current. In particular, the semiconductor chip is operated with a smaller current I2 in the reverse direction in the second operating mode B2 than in the forward direction in the first operating mode B1.

The exemplary embodiment in FIG. 3 shows a cross section of a motor vehicle headlight 100 that is in a first operating mode B1. The motor vehicle headlight 100 comprises a semiconductor chip 10 in accordance with the exemplary embodiment in FIGS. 1A and 1B. In this case, the motor vehicle headlight 100 can comprise a plurality of semiconductor chips 10 of this type (not illustrated). The semiconductor chip or semiconductor chips 10 is or are in this case arranged in a headlight housing 2 and emits or emit a radiation S in the first operating mode B1. As a result of the operation of the semiconductor chips in the first and second operating modes, it is possible to avoid possible condensation on the semiconductor chips on account of ambient moisture occurring, which is advantageous particularly in applications such as motor vehicle headlights, since the degradation of the semiconductor chips is thereby avoided. In addition, drastic wavelength shifts can thus be prevented.

Precisely in the case of motor vehicles which stand outside overnight in the switched-off state, for example, when the semiconductor chips are operated in the reverse direction it is possible to avoid condensation of air directly at the semiconductor chips, which condensation can conventionally arise at night. That has an advantageous effect on the lifetime of semiconductor chips of this type and accordingly of motor vehicle headlights of this type.

The invention is not restricted to the exemplary embodiments by the description on the basis of said exemplary embodiments, but rather encompasses any novel feature and also any combination of features, which in particular includes any combination of features in the patent claims, even if these features or these combinations themselves are not explicitly specified in the claims or exemplary embodiments.

The invention claimed is:

1. An optoelectronic semiconductor chip comprising:
a semiconductor layer sequence having an active layer configured to generate radiation,
wherein the semiconductor chip can be operated in a first operating mode and in a second operating mode,
wherein the semiconductor layer sequence emits radiation in the first operating mode,
wherein the semiconductor layer sequence emits no radiation in the second operating mode,
wherein the semiconductor layer sequence is operated in a forward direction in the first operating mode and in a reverse direction in the second operating mode, and
wherein, in the second operating mode, a temperature of the semiconductor layer sequence is higher by at least 2° C. than a temperature of the semiconductor layer sequence in a switched-off operating state.

2. The semiconductor chip according to claim 1, further comprising a drive device configured to operate the semiconductor chip in the first operating mode and in the second operating mode.

3. The semiconductor chip according to claim 1, wherein a leakage path is formed in the semiconductor layer sequence, and wherein, in the second operating mode, a predetermined reverse current flows via the leakage path.

4. The semiconductor chip according to claim 3, wherein a passivation layer is arranged on the semiconductor layer sequence, and wherein the leakage path is implemented via the passivation layer.

5. The semiconductor chip according to claim 1, wherein in the first operating mode a first operating current flows in the forward direction through the semiconductor layer sequence, and wherein in the second operating mode a second operating current flows in the reverse direction through the semiconductor layer sequence.

6. The semiconductor chip according to claim 5, wherein an absolute value of a current intensity of the second operating current is less than an absolute value of a current intensity of the first operating current.

7. The semiconductor chip according to claim 6, wherein the absolute value of the current intensity of the second operating current is 10% or less than the absolute value of the current intensity of the first operating current.

8. The semiconductor chip according to claim 1, wherein, in the second operating mode, the temperature of the semiconductor layer sequence is higher by 10° C. than the temperature of the semiconductor layer sequence in the switched-off operating state.

9. The semiconductor chip according to claim 1, wherein, in the second operating mode, a temperature of the semiconductor layer sequence is higher than an ambient temperature.

10. A display comprising a plurality of semiconductor chips according to claim 1.

11. A motor vehicle headlight comprising a semiconductor chip according claim 1.

12. A motor vehicle headlight comprising a display having a plurality of semiconductor chips according claim 1.

13. An optoelectronic semiconductor chip comprising:
a semiconductor layer sequence having an active layer configured to generate radiation,
wherein the semiconductor chip can be operated in a first operating mode and in a second operating mode,
wherein the semiconductor layer sequence emits radiation in the first operating mode, wherein the semiconductor layer sequence emits no radiation in the second operating mode, wherein, in the first operating mode, a first operating current flows in a forward direction through the semiconductor layer sequence, wherein, in the second operating mode, a second operating current flows in a reverse direction such that a temperature of the semiconductor layer sequence is higher by at least 2° C. than a temperature of the semiconductor layer sequence in a switched-off operating state, wherein the semiconductor layer sequence is operated in the forward direction in the first operating mode and in the reverse direction in the second operating mode; and wherein an absolute value of a current intensity of the second operating current is 10% or less than an absolute value of the current intensity of the first operating current.

14. The semiconductor chip according to claim 13, wherein, in the second operating mode, the second operating current flows in the reverse direction through the semiconductor layer sequence.

15. A method for operating a semiconductor chip, wherein the semiconductor chip comprises a semiconductor layer sequence having an active layer for generating radiation, the method comprising:

operating the semiconductor chip in a first operating mode by a first operating current flowing in a forward direction through the semiconductor layer sequence so that the semiconductor layer sequence emits radiation; and operating the semiconductor chip in a second operating mode by a second operating current flowing in a reverse direction so that the semiconductor layer sequence does not emit radiation, wherein a temperature of the semiconductor layer sequence, when operated in the second operating mode, is kept higher by at least 2° C. than a temperature of the semiconductor layer sequence in a switched-off operating state, and wherein an absolute value of a current intensity of the second operating current is 10% or less than of an absolute value of the current intensity of the first operating current.

16. The method according to claim 15, wherein, in the second operating mode, the semiconductor chip is operated in such a way that a temperature of the semiconductor layer sequence is kept higher than a temperature of a surrounding environment of the semiconductor chip.

17. The method according to claim 16, wherein the second operating mode is configured for reducing an effect of condensation of moisture on the semiconductor chip.

18. The method according to claim 15, wherein the second operating mode is operated for reducing a wavelength shift of the emitted radiation occurring on account of temperature changes upon switching-on the first operation mode.

* * * * *